United States Patent
Imer et al.

(10) Patent No.: US 8,097,481 B2
(45) Date of Patent: Jan. 17, 2012

(54) GROWTH OF NON-POLAR M-PLANE III-NITRIDE FILM USING METALORGANIC CHEMICAL VAPOR DEPOSITION (MOCVD)

(75) Inventors: Bilge M. Imer, Goleta, CA (US); James S. Speck, Goleta, CA (US); Steven P. DenBaars, Goleta, CA (US); Shuji Nakamura, Santa Barbara, CA (US)

(73) Assignees: The Regents of the University of California, Oakland, CA (US); Japan Science and Technology Agency, Saitama Prefecture (JP)

( * ) Notice: Subject to any disclaimer, the term of this patent is extended or adjusted under 35 U.S.C. 154(b) by 546 days.

(21) Appl. No.: 11/870,115

(22) Filed: Oct. 10, 2007

(65) Prior Publication Data
US 2008/0026502 A1    Jan. 31, 2008

Related U.S. Application Data

(63) Continuation of application No. 11/444,083, filed on May 31, 2006, now Pat. No. 7,338,828.

(60) Provisional application No. 60/685,908, filed on May 31, 2005.

(51) Int. Cl.
    *H01L 21/00*        (2006.01)
(52) U.S. Cl. .......... 438/46; 438/767; 438/481; 438/590; 438/604
(58) Field of Classification Search .................... 438/46, 438/767, 481, 590, 604
See application file for complete search history.

(56) References Cited

U.S. PATENT DOCUMENTS

| | | | |
|---|---|---|---|
| 5,923,950 | A | 7/1999 | Ishibashi et al. |
| 6,045,626 | A | 4/2000 | Yano et al. |
| 6,064,078 | A | 5/2000 | Northrup et al. |
| 6,069,021 | A | 5/2000 | Terashima et al. |
| 6,072,197 | A | 6/2000 | Horino et al. |
| 6,156,581 | A | 12/2000 | Vaudo et al. |
| 6,201,262 | B1 | 3/2001 | Edmond et al. |
| 6,316,785 | B1 | 11/2001 | Nunoue et al. |
| 6,440,823 | B1 | 8/2002 | Vaudo et al. |
| 6,468,882 | B2 | 10/2002 | Motoki et al. |

(Continued)

FOREIGN PATENT DOCUMENTS

EP      1385196      1/2004

(Continued)

OTHER PUBLICATIONS

Translation of Japanese reference 2000-216502 cited in rejection.*

(Continued)

*Primary Examiner* — Jarrett Stark
*Assistant Examiner* — John M Parker
(74) *Attorney, Agent, or Firm* — Gates & Cooper LLP

(57) ABSTRACT

A method of growing non-polar m-plane III-nitride film, such as GaN, AlN, AlGaN or InGaN, wherein the non-polar m-plane III-nitride film is grown on a suitable substrate, such as an m-SiC, m-GaN, $LiGaO_2$ or $LiAlO_2$ substrate, using metalorganic chemical vapor deposition (MOCVD). The method includes performing a solvent clean and acid dip of the substrate to remove oxide from the surface, annealing the substrate, growing a nucleation layer, such as aluminum nitride (AlN), on the annealed substrate, and growing the non-polar m-plane III-nitride film on the nucleation layer using MOCVD.

12 Claims, 7 Drawing Sheets

U.S. PATENT DOCUMENTS

| | | | |
|---|---|---|---|
| 7,091,514 | B2 | 8/2006 | Craven et al. |
| 7,186,302 | B2 * | 3/2007 | Chakraborty et al. .......... 148/33 |
| 2001/0042503 | A1 | 11/2001 | Lo et al. |
| 2002/0074552 | A1 | 6/2002 | Weeks et al. |
| 2002/0084467 | A1 | 7/2002 | Krames et al. |
| 2002/0144645 | A1 | 10/2002 | Kim et al. |
| 2002/0187356 | A1 | 12/2002 | Weeks et al. |
| 2003/0024475 | A1 | 2/2003 | Anderson |
| 2003/0198837 | A1 | 10/2003 | Craven et al. |
| 2004/0094773 | A1 | 5/2004 | Kiyoku et al. |
| 2004/0251471 | A1 | 12/2004 | Dwilinski et al. |
| 2004/0261692 | A1 | 12/2004 | Dwilinski et al. |
| 2005/0142391 | A1 | 6/2005 | Dmitriev et al. |
| 2005/0161697 | A1 | 7/2005 | Nakahata et al. |
| 2005/0205884 | A1 | 9/2005 | Kim et al. |
| 2005/0214992 | A1 | 9/2005 | Chakraborty et al. |
| 2005/0245095 | A1 | 11/2005 | Haskell et al. |
| 2005/0258451 | A1 | 11/2005 | Saxler et al. |
| 2006/0008941 | A1 | 1/2006 | Haskell et al. |
| 2006/0138431 | A1 | 6/2006 | Dwilinski et al. |
| 2006/0270076 | A1 | 11/2006 | Imer et al. |

FOREIGN PATENT DOCUMENTS

| | | | |
|---|---|---|---|
| JP | 02000216502 A | * | 8/2000 |
| WO | 03/089694 | | 10/2003 |

OTHER PUBLICATIONS

Shao, Y-P. et al., "Electrical Characterization of Semipolar Gallium Nitride Thin Films," NNIN REU Research Accomplishments, Aug. 2005, pp. 132-133.

Amano, H. et al, "Metalorganic vapor phase epitaxial growth of a high quality GaN film using an AlN buffer layer," Appl. Phys. Lett., 1986, pp. 353-355, vol. 48(5).

Amano, H. et al., "Stress and Defect Control in GaN using Low Temperature Interlayers," Jpn. J. Appl. Phys. 1998, pp. L1540-L1542, vol. 37.

Aoki, M. et al., "GaN single crystal growth using high-purity Na as a flux," J. of Crystal Growth 2002, pp. 70-76, vol. 242.

Aujol, E. et al., "Hydrogen and Nitrogen Ambient Effects on Epitaxial Growth of GaN by Hydride Vapour Phase Epitaxy," J. of Crystal Growth 2001, pp. 372-376, vol. 230.

Chakraborty, A. et al., "Defect reduction in nonpolar a-plane GaN films using in situ $SiN_x$ nanomask," Appl. Phys. Lett. 2006, pp. 041903-1-041903-3, vol. 89.

Chakraborty, A. et al., "Demonstration of Nonpolar m-plane in GaN/GaN Light Emitting Diodes on Free-Standing m-plane GaN Substrates," Jpn. J. of Appl. Phys. 2005, pp. L173-L175, vol. 44(5).

Chakraborty, A. et al., "Nonpolar InGaN/GaN emitters on reduced-defect lateral epitaxially overgrown a-plane with drive-current-independent electroluminescence emission peak," Appl. Phys. Lett. 2004, pp. 5143-5145, vol. 85(22).

Chitnis, A. et al., "Visible light-emitting diodes using a-plane GaN-InGaN multiple quantum wells over r-plane sapphire," Appl. Phys. Lett. 2004, pp. 3663-3665, vol. 84(18).

Chen, C. et al., "A New Selective Area Lateral Epitaxy Approach for Depositing a-Plane GaN over r-Plane Sapphire," Jpn. J. Appl. Phys. 2003, pp. L818-L820, vol. 42 (Part 2, No. 7B).

Craven, M.D. et al., "Threading dislocation reduction via laterally overgrown nonpolar (1120) a-plane GaN," Appl. Phys. Lett. 2002, pp. 1201-1203, vol. 81(7).

Craven, M.D. et al., "Structural characterization of nonpolar (1120) a-plane GaN thin films grown on (1102) r-plane sapphire," Appl. Phys. Lett. 2002, pp. 469-471, vol. 81(3).

Craven, M.D. et al., "Characterization of a-plane GaN(Al,Ga)N Multiple Quantum Wells Grown via Metalorganic Chemical Vapor Deposition," Jpn. J. Appl. Phys. 2003, pp. L235-L238, vol. 42 (Part 2, No. 3A).

Dovidenko, K. et al., "Characteristics of stacking faults in AlN thin films," J. Appl. Phys. 1997, pp. 4296-4299, vol. 82(9).

Dwilinski, R. et al., "AMMONO method of BN, AlN and GaN synthesis and crystal growth," MRS Internet Journal Nitride Semiconductor Research 3, 25, 1998, pp. 1-4.

Dwilinski, R. et al., "AMMONO method of GaN and AlN production," Diamond and Related Materials, 1998, pp. 1348-1350, vol. 7.

Eddy, C.R. et al., "Growth of gallium nitride thin films by electron cyclotron resonance microwave plasma-assisted molecular beam epitaxy," J. Appl. Phys. 1993, pp. 448-455, vol. 73(1).

Gardner, N.F. et al., "Polarization anisotropy in the electroluminescence of m-plane InGan-GaN multiple-quantum-well light-emitting diodes," Appl. Phys. Lett. 2005, pp. 111101-1-111101-3, vol. 86.

Ghandhi, VLSI Fabrication Principles: Silicon and Gallium Arsenide, $2^{nd}$ Ed., Wiley-Interscience, 1994, pp. 639-642.

Grzegory, A. et al., "Seeded growth of GaN at high $N_w$ pressure on (0001) polar surfaces of GaN single crystalline substrates," Materials Science in Semiconductor Processing 4 2001, pp. 535-541.

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Haskell, B.A. et al., "Defect reduction in (1120) a-plane gallium nitride via lateral epitaxial overgrowth by hydride vapor-phase epitaxy," Appl. Phys. Lett. 2003, pp. 644-646, vol. 83(4).

Haskell, B.A. et al., "Defect reduction in (1100) m-plane gallium nitride via lateral epitaxial overgrowth by hydride vapor phase epitaxy," Appl. Phys. Lett. 2005, pp. 111917-1-111917-3, vol. 86.

Inoue, T. et al., "Pressure-Controlled Solution Growth of Bulk GaN Crystals under High Pressure," Phys. Stat. Sol. (b) 2001, pp. 1-27, vol. 223(15).

Iwahashi, T. et al., "Effects of ammonia gas on threshold pressure and seed growth for bulk GaN single crystals by Na flux method," J. of Crystal Growth 2003, pp. 1-5, vol. 253.

Iwaya, M. et al., "Reduction of Etch Pit Density in Organometallic Vapor Phase Epitaxy-Grown GaN on Sapphire by Insertion of a Low-Temperature-Deposited Buffer Layer between High-Temperature-Grown GaN," Jpn. J. Appl. Phys. 1998, pp. L316-L318, vol. 37.

Kim, H-M. et al., "High-Brightness Light Emitting Diodes Using Dislocation-Free Indium Gallium Nitride/Gallium Nitride Multiquantum-Well Nanorod Arrays," Nano Letters 2004, pp. 1059-1062, vol. 4(6).

Kuokstis, E. et al., "Polarization effects in photoluminescence of C- and M-plane GaN/AlGaN multiple quantum wells," Appl. Phys. Lett. 2002, pp. 4130-4132, vol. 81(22).

Maruska, H.P. et al., "Development of 50 MM Diameter Non-Polar Gallium Nitride Substrates for Device Applications," IEEE 2003, pp. 567-570.

Metzger, TH. Et al., "X-Ray Diffraction Study of Gallium Nitride Grown by MOCVD," Phys. Stat. Sol. (b) 1996, pp. 391-397, vol. 193.

Moe, C.G. et al., "Milliwatt Power. Deep Ultraviolet Light Emitting Diodes Grown on Silicon Carbide," Jpn. J. Appl. Phys. 2005, pp. L502-L504, vol. 44(17).

Motoki, K. et al., "Preparation of Large Freestanding GaN Substrates by Hydride Vapor Phase Epitaxy Using GaAs as a Starting Substrate," Jnp. J. Appl. Phys. 2001, pp. L140-L143, vol. 40.

Moustakas, T.D. et al., "Growth of GaN by ECR-assisted MBE," Physica B, 1993, pp. 36-49, vol. 185.

Ng, H.M., "Molecular-beam epitaxy of $GaN/Al_xGa_{1-x}N$ multiple quantum wells on R-plane (1012) sapphire substrates," Appl. Phys. Lett. 2002, pp. 4369-4371, vol. 80(23).

Nishizuka, K. et al., "Efficient radiative recombination from <1122>-oriented in $In_xGa_{1-x}N$ multiple quantum wells fabricated by the regrowth technique," Appl. Phys. Lett 2004, pp. 3122-3124, vol. 85(15).

Ohba, Y. et al., "A study on strong memory effects for Mg doping in GaN metalorganic chemical vapor deposition," J. Cryst. Growth 1994, pp. 214-218, vol. 145.

Okamoto, K. et al., "Near-field scanning optical microscopy of photonic crystal nanocavities," Appl. Phys. Lett. 2003, pp. 1676-1678, vol. 82(11).

Patent Abstracts of Japan, vol. 2002, No. 04, Aug. 4, 2002 & JP 2001 342100 A (Toshiba Corp), Dec. 11, 2001.

Sano, M. et al., "Epitaxial Growth of Undoped and Mg-doped GaN," Jpn. J. Appl. Phys. 1976, pp. 1943-1950, vol. 15(10).

Schmidt, H. et al., "Giant Kerr nonlinearities obtained by electromagnetically induced transparency," Optics Lett. 1996, pp. 1936-1938, vol. 21(23).

Schmidt, E. et al., "Mutational. Profile of the PTEN Gene in Primary Human Astrocytic Tumors and Cultivated Xenografts," J. Neur. Exp. Neur. 1999, pp. 1170-1183, vol. 58(11).

Sun, C.-J. et al., "Comparison of the physical properties of GaN thin films deposited on (0001) and (0112) sapphire substrates," Appl. Phys. Lett. 1993, pp. 973-975, vol. 63, XP-002251480.

Sun, Y.J. et al., "In surface segregation on *M*-plane (In/Ga)N/GaN multiple quantum well structures," Appl. Phys. Lett. 2003, pp. 5178-5180, vol. 83(25).

Tsuchiya, H. et al., "Growth condition dependence of GaN crystal structure of (0 0 1)GaAs by hydride vapor-phase epitaxy," J. Cryst. Growth 1998, pp. 395-400, vol. 189/190.

Usui, A. et al., "Thick GaN Epitaxial Growth with Low Dislocation Density by Hydride Vapor Phase Epitaxy," Jpn. J. Appl. Phys. 1997, pp. L899-L902, vol. 36(Part 2, 7B).

Grandjean, N., et al., Epitaxial relationships between GaN and Al2O3(0001) substrates, Applied Physics Letters, AIP, American Institute of Physics, Mellville, NY, US LNKD-DOI: 1063/1.118205, vol. 70, No. 5, Feb. 3, 1997, p. 643, XP012018288.

Haskell, B., et al., Microstructure and enhanced morphology of planar nonpolar m-plane GaN grown by hydride vapor phase epitaxy, Journal of Electronic Materials TMS; IEEE USA, vol. 34, No. 4, Apr. 2005, pp. 357-360, XP002591137.

Waltereit, P., et al., Nitride semiconductors free of electrostatic fields for efficient white light-emitting diodes, Nature MacMillan Magazines UK, vol. 406, No. 6798, Aug. 24, 2000, pp. 865-868, XP002591136, ISSN: 0028-0836.

Xu, Ke., et al., MOCVD Growth of GaN on LiAlO2(100) Substrates, Physica Status Solidi A, vol. 176, No. 1, Nov. 16, 1999, pp. 589-593, XP002591134.

EP Extended Search Report, EP application No. 06760566.7, dated Aug. 3, 2010.

* cited by examiner

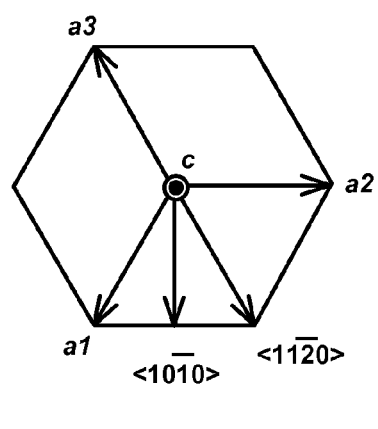
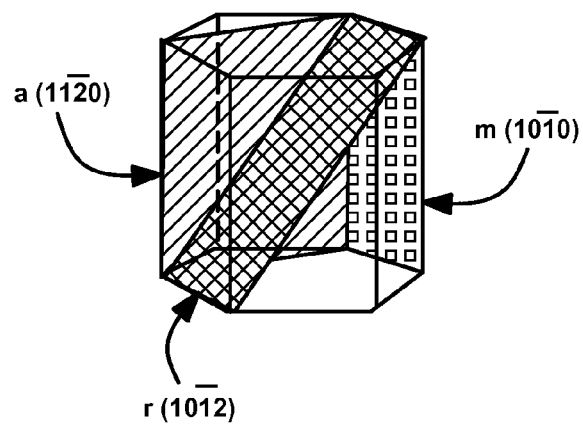
FIG. 1(a)                    FIG. 1(b)

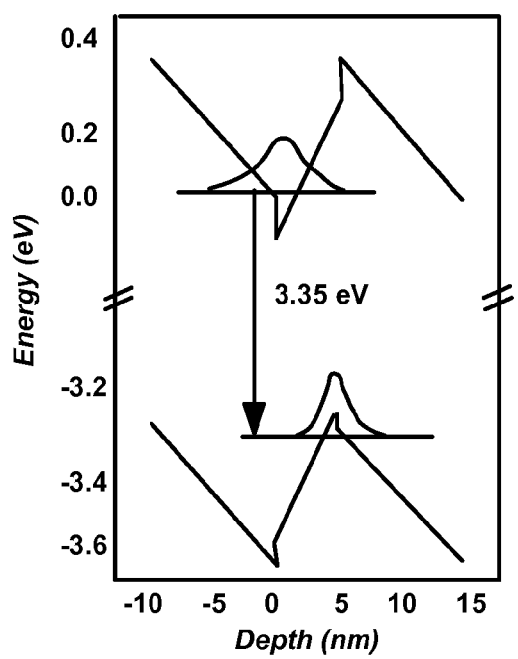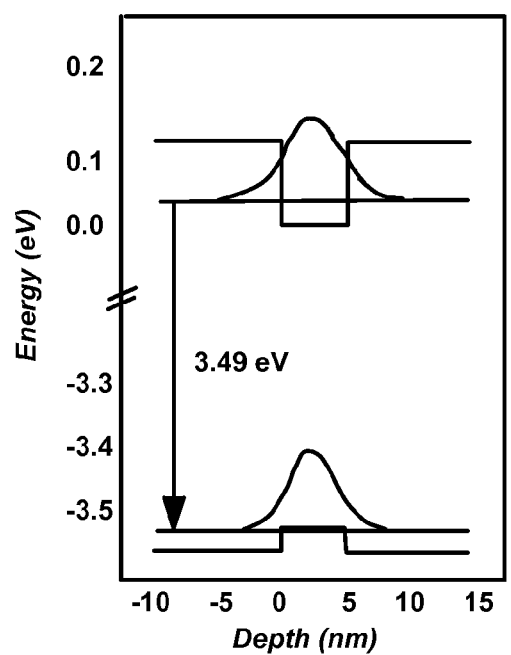
FIG. 2(a)  FIG. 2(b)

U.S. 8,097,481 B2

GROWTH OF NON-POLAR M-PLANE III-NITRIDE FILM USING METALORGANIC CHEMICAL VAPOR DEPOSITION (MOCVD)

CROSS-REFERENCE TO RELATED APPLICATIONS

This application is a continuation that claims the priority under 35 U.S.C. Section 120 of U.S. Utility patent application Ser. No. 11/444,083, filed on May 31, 2006, by Bilge M. Imer, James S. Speck and Steven P. Denbaars, entitled "GROWTH OF PLANAR NON-POLAR {1-1 0 0} M-PLANE GALLIUM NITRIDE WITH METALORGANIC CHEMICAL VAPOR DEPOSITION (MOCVD)," now U.S. Pat. No. 7,338,828, issued Mar. 4, 2008, which application claims the benefit under 35 U.S.C. Section 119(e) of U.S. Provisional Patent Application Ser. No. 60/685,908, filed on May 31, 2005, by Bilge M. Imer, James S. Speck and Steven P. Denbaars, entitled "GROWTH OF PLANAR NON-POLAR {1-1 0 0} M-PLANE GALLIUM NITRIDE WITH METALORGANIC CHEMICAL VAPOR DEPOSITION (MOCVD)," both of which applications are incorporated by reference herein.

This application is related to the following co-pending and commonly-assigned applications:

U.S. Utility patent application Ser. No. 11/444,084, filed on May 31, 2006, by Bilge M. Imer, James S. Speck and Steven P. DenBaars, entitled "DEFECT REDUCTION OF NON-POLAR AND SEMI-POLAR III-NITRIDES WITH SIDEWALL LATERAL EPITAXIAL OVERGROWTH (SLEO)," now U.S. Pat. No. 7,361,576, issued Apr. 22, 2008, which application claims the benefit under 35 U.S.C. Section 119(e) of U.S. Provisional Patent Application Ser. No. 60/685,952, filed on May 31, 2005 by Bilge M. Imer, James S. Speck and Steven P. DenBaars, entitled "DEFECT REDUCTION OF NON-POLAR GALLIUM NITRIDE WITH SINGLE-STEP SIDEWALL LATERAL EPITAXIAL OVERGROWTH,"

U.S. Utility patent application Ser. No. 10/537,385, filed Jun. 3, 2005, by Benjamin A. Haskell, Paul T. Fini, Shigemasa Matsuda, Michael D. Craven, Steven P. Denbaars, James S. Speck, And Shuji Nakamura, entitled "Growth Of Planar, Non-Polar A-Plane Gallium Nitride By Hydride Vapor Phase Epitaxy," now U.S. Pat. No. 7,427,555, issued Sep. 23, 2008, which application claims priority to International Patent Application No. PCT/US03/21916, filed Jul. 15, 2003, by Benjamin A. Haskell, Paul T. Fini, Shigemasa Matsuda, Michael D. Craven, Steven P. Denbaars, James S. Speck, And Shuji Nakamura, entitled "Growth Of Planar, Non-Polar A-Plane Gallium Nitride By Hydride Vapor Phase Epitaxy," Which application claims priority to U.S. Provisional Patent Application Ser. No. 60/433,844, filed Dec. 16, 2002, by Benjamin A. Haskell, Paul T. Fini, Shigemasa Matsuda, Michael D. Craven, Steven P. Denbaars, James S. Speck, And Shuji Nakamura, Entitled "Technique For The Growth Of Planar, Non-Polar A-Plane Gallium Nitride By Hydride Vapor Phase Epitaxy,"

U.S. Utility patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION," which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,"

all of which applications are incorporated by reference herein.

BACKGROUND OF THE INVENTION

1. Field of the Invention

The present invention relates to the growth of non-polar m-plane III-nitride film using metalorganic chemical vapor deposition (MOCVD).

2. Description of the Related Art

Gallium nitride (GaN) and its ternary and quaternary compounds are prime candidates for fabrication of visible and ultraviolet high-power and high-performance optoelectronic devices and electronic devices. These devices are typically grown epitaxially by growth techniques including molecular beam epitaxy (MBE), metalorganic chemical vapor deposition (MOCVD), or hydride vapor phase epitaxy (HVPE).

The selection of substrate is critical for achieving the desired GaN growth orientation. Some of the most widely used substrates for III-N growth include SiC, $Al_2O_3$, and $LiAlO_2$. Various crystallographic orientations of these substrates are commercially available.

FIGS. 1(a) and 1(b) are schematics of crystallographic directions and planes of interest in hexagonal GaN. Specifically, these schematics show the different crystallographic growth directions and also the planes of interest in the hexagonal wurtzite GaN structure, wherein FIG. 1(a) shows the crystallographic directions a1, a2, a3, c, <10-10> and <11-20>, and FIG. 1(b) shows planes a (11-20), m (10-10) and r (10-12). The fill patterns of FIG. 1(b) are intended to illustrate the planes of interest, but do not represent the materials of the structure.

It is relatively easy to grow planar c-plane GaN due to its large growth stability window. Therefore, nearly all GaN-based devices are grown parallel to the polar c-axis. However, as a result of c-plane growth, each material layer suffers from separation of electrons and holes to opposite faces of the layers. Furthermore, strain at the interfaces between adjacent layers gives rise to piezoelectric polarization, causing further charge separation.

FIGS. 2(a) and 2(b), which are schematics of band bending and electron hole separation as a result of polarization, show this effect, wherein FIG. 2(a) is a graph of energy (eV) vs. depth (nm) and represents a c-plane quantum well, while FIG. 2(b) is a graph of energy (eV) vs. depth (nm) and represents a non-polar quantum well.

Such polarization effects decrease the likelihood of electrons and holes recombining, causing the final device to perform poorly. One possible approach for eliminating piezoelectric polarization effects in GaN optoelectronic devices is to grow the devices on non-polar planes of the crystal such as a-{11-20} and m-{1-100} planes family of GaN. Such planes contain equal numbers of Ga and N atoms and are charge-neutral.

Planar {1-100} m-plane GaN growth has been developed by HVPE and MBE methods. However, prior to the invention described herein, planar m-plane GaN growth had not been accomplished with MOCVD.

SUMMARY OF THE INVENTION

The general purpose of the present invention is to grow non-polar m-plane III-nitride film using MOCVD. The method includes performing a solvent clean and acid dip of an m-SiC substrate to remove oxide from the surface of the substrate ex situ prior to growth, in situ annealing of the substrate, growing a nucleation layer on the annealed substrate, and growing the non-polar m-plane III-nitride film on the nucleation layer using MOCVD. The present invention takes advantage of non-polar nature of the m-plane III-nitride film to eliminate polarization fields, and gives rise to flexibility in growth variables, such as temperature, pressure and precursor flows, utilizing the advantage of the m-plane III-nitride film's stability during growth.

BRIEF DESCRIPTION OF THE DRAWINGS

Referring now to the drawings in which like reference numbers represent corresponding parts throughout:

FIGS. 1(a) and 1(b) are schematics of crystallographic directions and planes of interest in hexagonal GaN.

FIGS. 2(a) and 2(b) are schematics of band bending and electron hole separation as a result of polarization.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The growth of (Ga, In, Al, B)N materials in the polar [0001] c-direction causes lower performance in optical devices due to polarization fields causing charge separation along the primary conduction direction. Therefore, recent research has been conducted focusing on non-polar direction growth along a-[11-20] and m-[1-100] directions of these materials to eliminate such effects and so to improve the device performance significantly. While both a-plane and m-plane growth of GaN has been explored by HVPE and MBE, only non-polar a-{11-20} plane growth of GaN has been demonstrated by MOCVD. However, it has been found that the growth window for planar a-plane GaN is very small and this specific orientation is very sensitive to changes in growth variables such as pressure and precursor flows. This resulted in the exploration of a new non-polar orientation in GaN growth with MOCVD. However, for m-plane growth, substrate availability has been a problem due to high growth temperatures required in MOCVD. Commercially available substrates such as γ-LiAlO$_2$ have melting points lower than the temperature required for MOCVD growth. With the emergence of commercially obtainable m-SiC substrates, which are stable during MOCVD growth, the current invention was made possible. The present invention is the first ever successful growth of m-{1-100} plane GaN on m-SiC by MOCVD.

Technical Description

Figure 3:
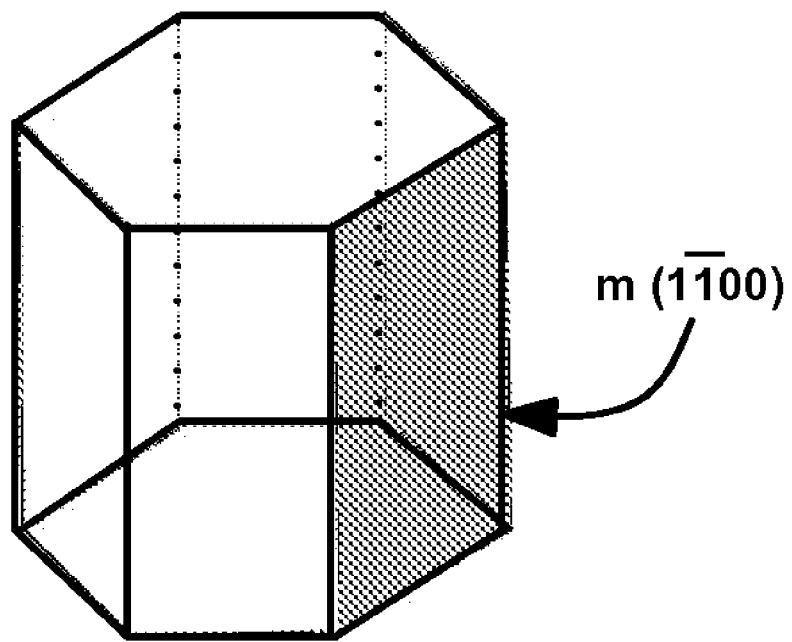
FIG. 3 provides a structural characterization of non-polar planar m-plane GaN on m-plane SiC, from top to bottom, wherein the crystal plane of interest is shown in a unit cell/

The m-plane SiC substrate is annealed in hydrogen prior to growth. An AlN layer is formed as a nucleation layer before GaN film growth. Finally, a GaN layer is grown by MOCVD. FIG. 3 illustrates the non-polar m-plane GaN (1-100) crystal plane of interest in the unit cell.

To accomplish the optimum quality m-plane GaN, V/III ratios of 400-5500 and 200-3000, growth pressures varying in between 50-760 Torr, and temperature series of 1100° C.-1275° C. and 1000° C.-1160° C. for AlN and GaN layers were tested, respectively. The m-plane, for both AlN and GaN, was stable over this wide range of temperatures, reactor pressures, and precursor flows.

The optimum AlN nucleation layers, leading to best quality GaN films, were realized at temperatures over 1175° C., at relatively low pressures, and V/III ratio of 3500 with the nucleation layer thickness below 150 nm.

For GaN layer epitaxy, the most favorable conditions were realized at low pressures, such as below 100 Torr, at temperatures in the range of 1100° C.-1160° C., and at V/III ratios below 700 with low NH$_3$ vapor pressure.

Figure 4:
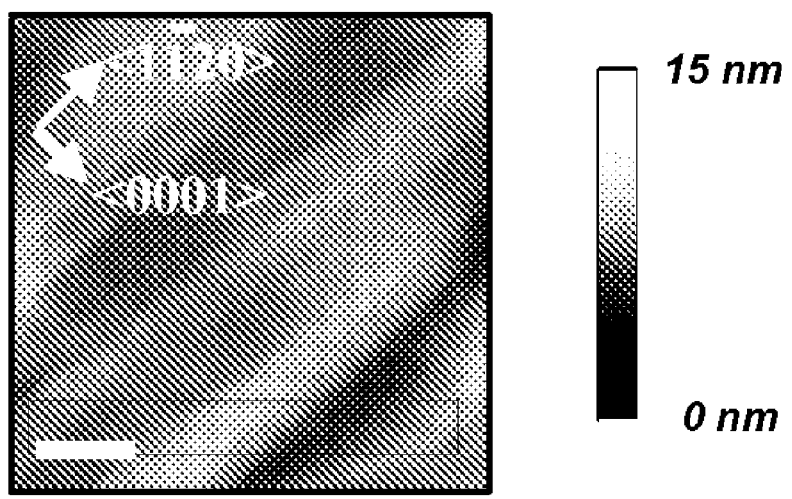
FIG. 4 is a 5 μm×5 μm atomic force microscopy (AFM) surface image with a surface roughness value 2.54 nm.

A 5 μm×5 μm atomic force microscopy (AFM) surface image of the resulting m-plane GaN material is shown in FIG. 4. The grains are oriented along the <11-20> direction and the surface roughness value (root mean square) is ~2.54 nm for a 5 μm×5 μm scan.

Figure 5:
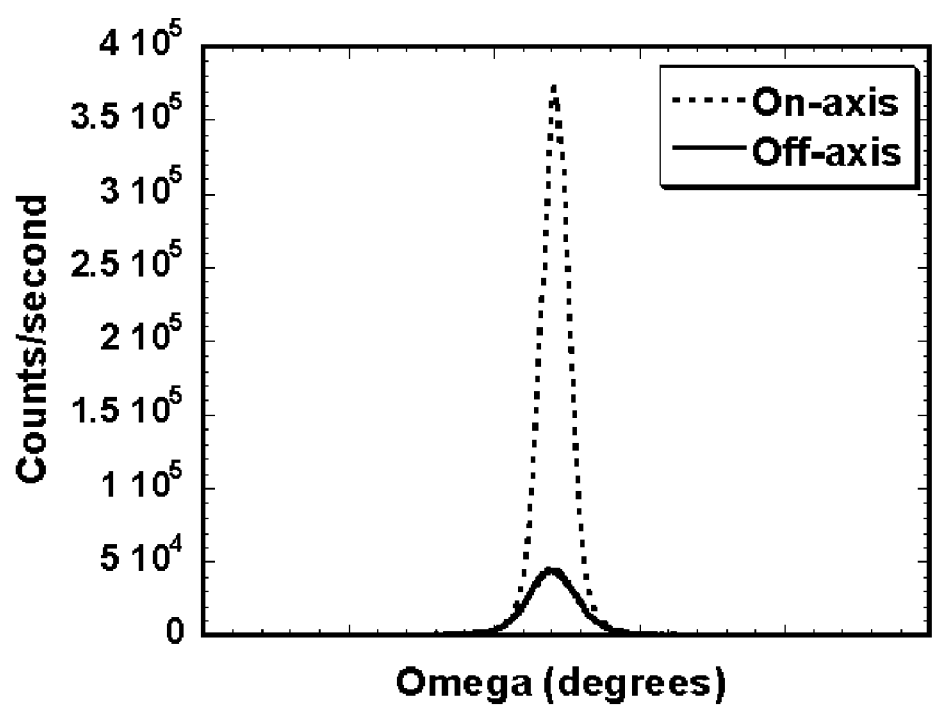
FIG. 5 is a graph that illustrates the xray diffraction rocking curves for on-axis and off-axis.

FIG. 5 is a graph of omega (degrees) vs. counts/second showing the x-ray diffraction rocking curves on-axis and off-axis. As can been seen from Table 1 below, on-axis (1-100) full width at half max (FWHM) values are measured as low as 0.22° and 1.2°, for a-mosaic and c-mosaic, respectively, and the off-axis (10-12) reflection has FWHM value of 0.38°. These roughness and FWHM values were found to not change significantly by changing growth conditions of the nucleation layer and epitaxial GaN film itself.

TABLE 1

| Rocking curve FWHM values | | |
|---|---|---|
| On-Axis Values | | |
| a-mosaic | c-mosaic | Off-Axis |
| 0.22° | 1.2° | 0.38° |

Process Steps

Figure 6:
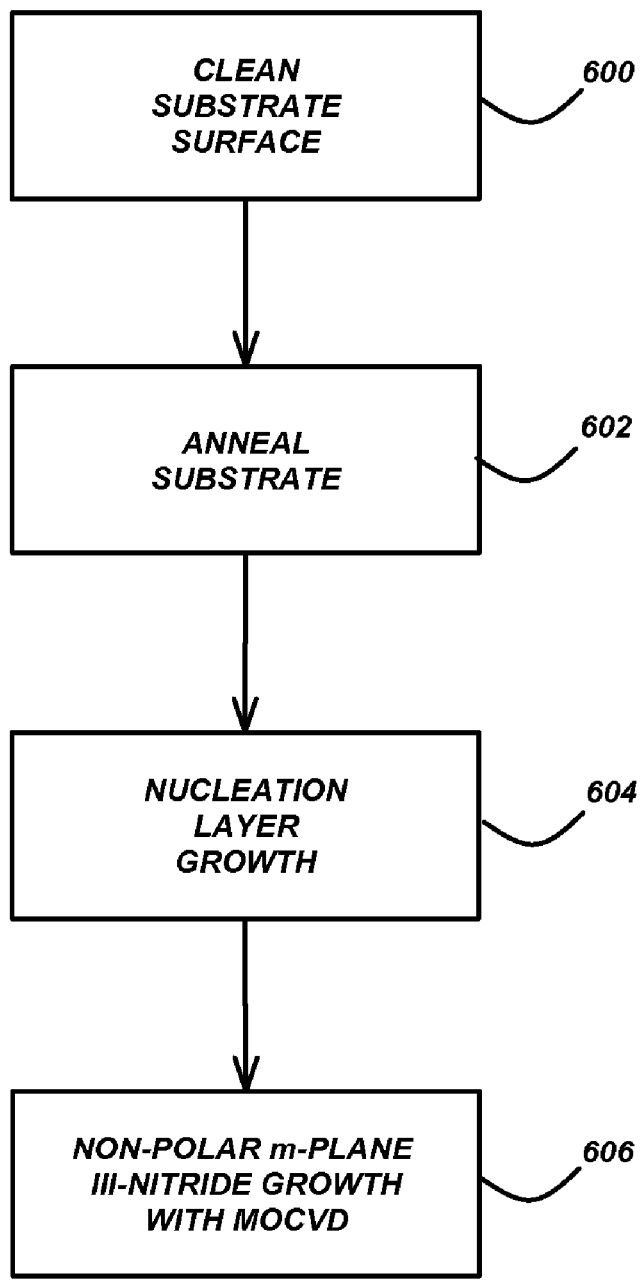
FIG. 6 is a flowchart that illustrates the processing steps for growing planar m-plane III-Nitrides using MOCVD according to the preferred embodiment of the present invention.
Figure 7:
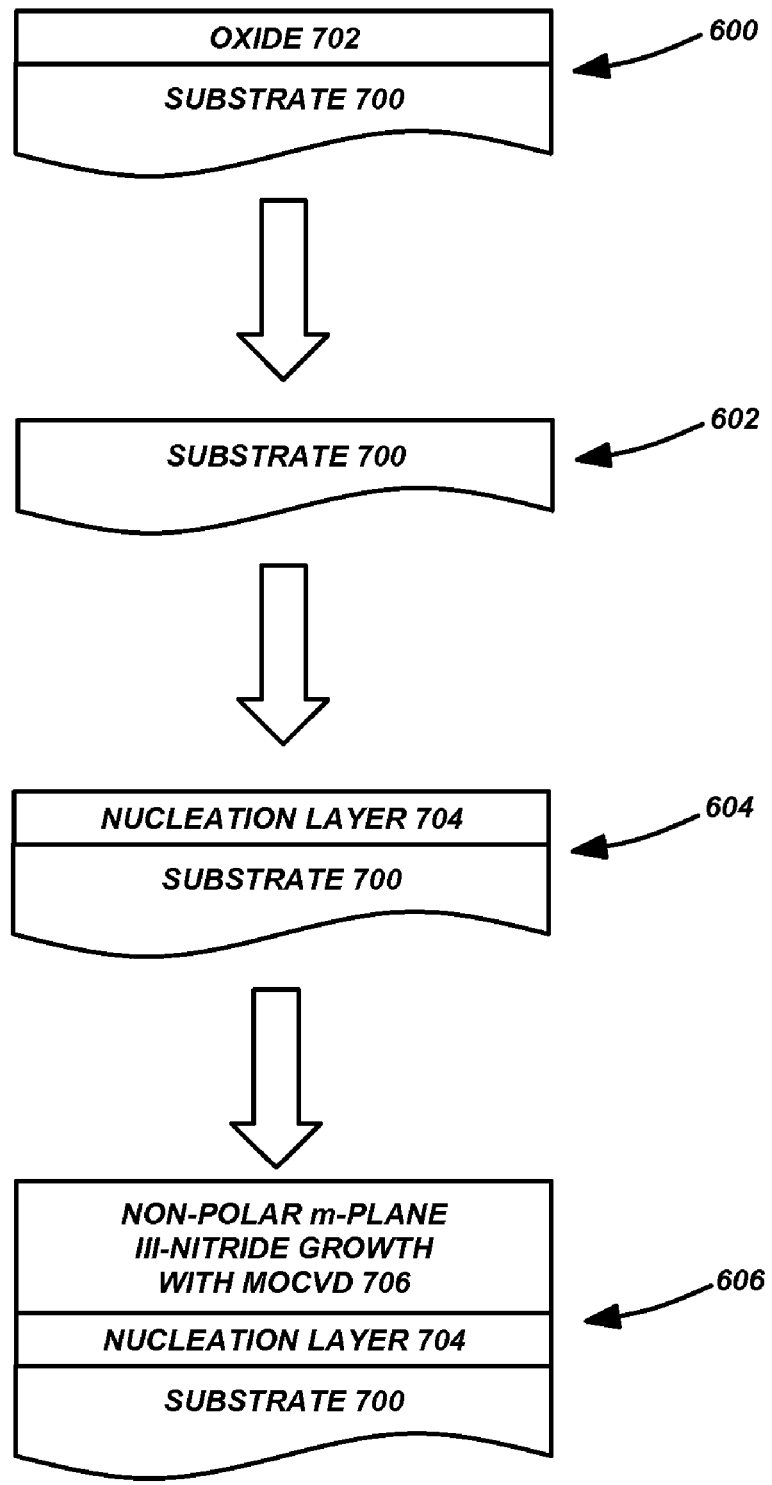
FIG. 7 further illustrates the results of the processing steps of FIG. 6 according to the preferred embodiment of the present invention.

FIG. 6 is a flowchart that illustrates the processing steps for growing a planar non polar {1-100} m-plane III-Nitride epitaxial film using MOCVD according to the preferred embodiment of the present invention, wherein the planar non polar m-plane III-Nitride epitaxial film may comprise a planar m-plane GaN epitaxial layer. FIG. 7 further illustrates the results of each of the processing steps of FIG. 6.

Block 600 represents a solvent clean and acid dip of a suitable substrate (700), for example, in a 1:10 diluted BHF:DI solution, to remove oxide (702) from the substrate (700) surface before loading the substrate (700) into a reactor for the growth step. (Although this step is recommended, its omission would not significantly alter the results.) The substrate (700) may comprise an m-SiC or any substrate that is suitable for non-polar m-plane III-Nitride growth.

Block 602 represents in situ annealing of the substrate (700), for example, in hydrogen, prior to the growth step. (Although this step is recommended, its omission would not significantly alter the results.)

Block 604 represents growing a nucleation layer (704) on the substrate (700). The nucleation layer (704) typically comprises an aluminum nitride (AlN) nucleation layer or interlayer, but may comprise any nucleation layer (704) that is appropriate for non-polar m-plane III-Nitride growth. Moreover, the nucleation layer (704) may be grown after the annealing step, and prior to the non polar m-plane III-Nitride growth.

Block 606 represents growing the non-polar m-plane III-Nitride epitaxial layer (706) using MOCVD. The non-polar m-plane III-Nitride epitaxial layer (706) typically comprises a non-polar m-plane GaN epitaxial layer, but may comprise other non-polar m-plane III-Nitride epitaxial layers as well. Moreover, the non-polar m-plane III-Nitride epitaxial layer (706) may be grown on the nucleation layer (704), or on the substrate (700) itself.

Preferably, the end result is a device, or a free standing wafer, or a substrate, or a template, having a planar epitaxial layer of the non-polar m-plane III-Nitride.

Possible Modifications and Variations

Although the preferred embodiment describes the MOCVD growth of non-polar m-GaN on m-SiC using an AlN interlayer, alternative suitable substrates, on which the non-polar m-plane III-Nitride epitaxial film could be formed, include, but are not limited to, 6H or 4H m-plane SiC, free-standing m-GaN, LiGaO$_2$ and LiAlO$_2$.

Prior to growth, the suitable substrate can be treated in many different ways in-situ or ex-situ, or it may not be treated at all.

The non-polar epitaxial film can be nucleated and grown over different nucleation layers, such as GaN or AlN grown at various conditions and methods, or over a bare substrate.

The epitaxial film can be any non-polar m-plane III-Nitride material including, but not limited to, GaN, AlN, AlGaN and InGaN with various thicknesses.

The growth parameters required for the growth of non-polar m-plane III-Nitride material may vary from reactor to reactor.

Finally, it is understood that processing steps may be omitted, added or rearranged as desired.

Such variations do not fundamentally alter the general practice of this invention.

Advantages and Improvements

The growth of m-{1-100} plane GaN has been successfully demonstrated by HVPE and MBE. However, the present invention is the first-ever successful demonstration of high-quality planar non-polar m-{1-100} plane GaN growth by MOCVD.

Growth of planar m-plane GaN has an advantage over growth of planar a-{11-20} GaN with MOCVD in terms of its stability with a large growth window. This was shown when growth variables such as temperature, pressure and precursor flows for AlN nucleation layer and GaN epitaxial film were changed.

To accomplish the optimum quality m-plane GaN, V/III ratios of 400-5500 and 200-3000, growth pressures varying in between 50-760 Torr, and temperature series of 1100° C.-1275° C. and 1000° C.-1160° C. for AlN and GaN layers were tested, respectively. Alterations in such conditions did not affect the crystal and surface quality significantly unlike the planar non-polar a-plane GaN films in which crystal and surface quality are extremely susceptible to change in growth conditions and constrained with small growth window.

The growth stability advantage combined with the non-polar nature of m-GaN brings new possibilities in III-Nitride non-polar device research.

REFERENCES

The following reference is incorporated by reference herein:
1. "Molecular-beam epitaxy of GaN/Al$_x$Ga$_{1-x}$N multiple quantum wells on R-plane (10-12) sapphire substrates," H. M. Ng, Appl. Phys. Lett. 80, 4369 (2002)

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, such as additional adjustments to the process described herein, without fundamentally deviating from the essence of the present invention. It is intended that the scope of the invention be limited not by this detailed description, but rather by the claims appended hereto.

What is claimed is:

1. A method of growing a non-polar m-plane III-nitride film, comprising:
   (a) growing an initial non-polar m-plane III-nitride film on a suitable substrate using metalorganic chemical vapor deposition (MOCVD), wherein a top surface of the initial non-polar m-plane III-nitride film is a planar m-plane of III-nitride including an area having with a root mean square surface roughness of not more than 2.54 nanometers at least for an area of 5 micrometers by 5 micrometers.

2. The method of claim 1, wherein the substrate comprises a SiC-substrate.

3. The method of claim 1, wherein the non-polar m-plane III-nitride film comprises GaN, AlN, AlGaN or InGaN.

4. The method of claim 1, further comprising growing a nucleation layer on the substrate and growing the non-polar m-plane III-nitride film on the nucleation layer.

5. The method of claim 4, wherein the nucleation layer comprises aluminum nitride (AlN).

6. The method of claim 1, wherein the growing step comprises the steps of:
   (1) performing a solvent clean and acid dip of the substrate to remove oxide from the substrate surface;
   (2) annealing the substrate after performing the solvent clean and acid dip;
   (3) growing a nucleation layer on the substrate after the annealing step; and
   (4) growing an epitaxial layer of the non polar m-plane III-nitride film on the nucleation layer.

7. The method of claim 1, wherein the substrate is a GaN substrate.

8. The method of claim 1, wherein the growing is such that the film is sufficiently thick to be free-standing.

9. The method of claim 1, wherein the substrate is a LiGaO$_2$ or LiAlO$_2$ substrate.

10. The method of claim 1, wherein the growing is such that individual grains of the film are not distinguishable based on height measurements.

11. The method of claim 1, wherein the top surface results from predominantly stepped growth.

12. A device, wafer, substrate or template fabricated using the method of claim 1.

* * * * *